United States Patent
Mahdavifar et al.

(10) Patent No.: US 9,479,291 B2
(45) Date of Patent: Oct. 25, 2016

(54) APPARATUS AND METHOD OF CONSTRUCTING POLAR CODE

(71) Applicant: Samsung Electronics Co., Ltd., Gyeonggi-do (KR)

(72) Inventors: Hessam Mahdavifar, San Diego, CA (US); Mostafa El-Khamy, San Diego, CA (US); Jungwon Lee, San Diego, CA (US); Inyup Kang, San Diego, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/837,763

(22) Filed: Aug. 27, 2015

(65) Prior Publication Data

US 2016/0241355 A1 Aug. 18, 2016

Related U.S. Application Data

(60) Provisional application No. 62/116,088, filed on Feb. 13, 2015.

(51) Int. Cl.
  *H01L 27/00* (2006.01)
  *H04L 1/00* (2006.01)
  *H04L 1/20* (2006.01)

(52) U.S. Cl.
  CPC ............... *H04L 1/009* (2013.01); *H04L 1/203* (2013.01)

(58) Field of Classification Search
  CPC ............................ H04L 1/009; H04L 1/203
  USPC .................................................. 375/285, 259
  See application file for complete search history.

(56) References Cited

U.S. PATENT DOCUMENTS

| 2013/0117344 A1 | 5/2013 | Gross et al. |
| 2013/0254466 A1 | 9/2013 | Jiang et al. |

(Continued)

FOREIGN PATENT DOCUMENTS

| CN | 102164025 | 8/2011 |
| CN | 102694625 | 9/2012 |
| KR | 10-1271473 | 6/2013 |
| WO | WO 2013152605 | 10/2013 |
| WO | WO 2014116301 | 7/2014 |
| WO | WO 2014134974 | 9/2014 |

OTHER PUBLICATIONS

Erdal Arikan, Channel polarization: A method for constructing capacity-achieving codes for symmetric binary-input memoryless channels IEEE Transactions on Information Theory, vol. 55, No. 7, pp. 3051-3073, Jul. 2009.

(Continued)

*Primary Examiner* — Helene Tayong
(74) *Attorney, Agent, or Firm* — The Farrell Law Firm, P.C.

(57) ABSTRACT

An apparatus and method of constructing a universal polar code is provided. The apparatus includes a first function block configured to polarize and degrade a class of channels $W_j$ to determine a probability of error $P_{e,j}$ of each bit-channel of $W_j$, wherein $j \in \{1, 2, \ldots, s\}$, in accordance with a bit-channel index i; a second function block configured to determine a probability of error $P_e^{(i)}$ for the universal polar code for each bit-channel index i; a third function block configured to sort the $P_e^{(i)}$; and a fourth function block configured to determine a largest number k of bit-channels such that a sum of corresponding k bit-channel error probabilities $P_e^{(i)}$ is less than or equal to a target frame error rate $P_t$ for the universal polar code, wherein the indices corresponding to the k smallest $P_e^{(i)}$ are good bit-channels for the universal polar code.

20 Claims, 5 Drawing Sheets

(56) References Cited

U.S. PATENT DOCUMENTS

2013/0272704 A1   10/2013   Zamani et al.
2013/0283116 A1   10/2013   Arikan
2013/0283128 A1   10/2013   Lee et al.
2014/0019820 A1   1/2014    Vardy et al.
2014/0108748 A1   4/2014    Lee et al.
2014/0169388 A1   6/2014    Jeong et al.
2014/0169492 A1   6/2014    Mahdavifar et al.
2014/0173376 A1   6/2014    Jeong et al.
2014/0208183 A1   7/2014    Mahdavifar et al.
2014/0365842 A1   12/2014   Li et al.
2015/0091742 A1*  4/2015    Ionita ................ H04L 25/4917
                                                         341/57

OTHER PUBLICATIONS

Ido Tal et al, How to construct polar codes, IEEE Transactions on Information Theory, vol. 59, No. 10, pp. 6562-6582, Apr. 10, 2013.

Trifonov, Efficient Design and Decoding of Polar Codes, Communications, IEEE Transactions on , vol. 60, No. 11, pp. 3221-3227, Nov. 2012.

Mine Alsan, Universal Polarization Codes, EDIC Research Proposal; LTHI, I&C, EPFL, May 5, 2009.

* cited by examiner

US 9,479,291 B2

APPARATUS AND METHOD OF CONSTRUCTING POLAR CODE

PRIORITY

This application claims priority under 35 U.S.C. §119(e) to a U.S. Provisional Patent Application filed on Feb. 13, 2015 in the United States Patent and Trademark Office and assigned Ser. No. 62/116,088, the entire contents of which are incorporated herein by reference.

BACKGROUND OF THE DISCLOSURE

1. Field of the Disclosure

The present disclosure relates generally to constructing a polar code, and more particularly, to constructing a polar code for an arbitrary class of channels, which is universally good for the class of channels with a certain Frame Error Rate (FER) across all of the channels.

2. Description of the Related Art

Polar codes are the first and currently only family of codes with explicit construction (i.e., no ensemble to pick from) and low-complexity encoding and decoding algorithms that achieve the capacity over a certain class of channels. A polar transformation is defined as a multiplication of an input vector by a polarization matrix $$G^{\otimes l} = \begin{bmatrix} 1 & 0 \\ 1 & 1 \end{bmatrix}^{\otimes l}.$$

Polar code construction, or channel polarization, is based on the observation that as a length $n=2^l$ of a polar transformation increases, the observed bit-channels at the input are polarized so that they become either noiseless (perfect) channels or completely noisy channels. A polar code is constructed by transmitting information bits over the noiseless channels, also referred to as good bit-channels, while restricting (or freezing) the input to the noisy channels, also referred to as bad bit-channels, to zeros.

Constructing polar codes (i.e., finding good bit-channels) is, in general, a difficult problem. There are some heuristic and approximate algorithms that attempt to solve the problem. However, they only concern one given channel and do not disclose a method of constructing a polar code that is universally good for an arbitrary class of channels.

Another complicating factor is that the construction of polar codes, in general, depends on the characteristics of the underlying channel. As a result, if a polar code is optimized for transmission across a certain channel, it may not be good for transmission over another channel. This is a challenge in constructing polar codes suitable for a practical application, because in a communications system, the underlying channel varies. Thus, there is a need for an apparatus and method of constructing a polar code that is robust to channel variations.

SUMMARY

The present disclosure has been made to address the above-mentioned problems and disadvantages, and to provide at least the advantages described below.

Accordingly, an aspect of the present disclosure is to provide an apparatus for and a method of constructing a polar code that has universally good performance over a given class of channels.

Another aspect of the present disclosure is to provide an apparatus for and a method of constructing a polar code with a guaranteed maximum error probability when transmitted over any channel in a given class of channels, where the class of channels is a class of binary-input channels having the same capacity.

Another aspect of the present disclosure is to provide an apparatus and a method of using each bit-channel index of a polar code that corresponds to a transmission channel in a class of transmission channels to determine an upper bound of a probability of error of each transmission channel in the class of transmission channels and a maximum error probability over the whole class of transmission channels.

Another aspect of the present disclosure is to construct a polar code by sorting bit-channel indices according to their error probabilities, determining the channels that are universally good over all of the transmission channels in the class to be the good bit-channels of the polar code, wherein the good-bit channels may be selected as the bit-channels having the smallest attribute error probabilities such that their aggregate error probability over any transmission channel in the class of transmission channels does not exceed a target frame error rate.

In accordance with an aspect of the present disclosure, an apparatus for constructing a universal polar code is provided. The apparatus includes an apparatus for constructing a universal polar code, comprising: a first function block configured to polarize and degrade a class of channels $W_j$ to determine a probability of error $P_{e,j}$ of each bit-channel of $W_j$, wherein $j \in \{1, 2, \ldots, s\}$, in accordance with a bit-channel index i; a second function block configured to determine a probability of error $P_e^{(i)}$ for the universal polar code for each bit-channel index i; a third function block configured to sort the $P_e^{(i)}$; and a fourth function block configured to determine a largest number k of bit-channels such that a sum of corresponding k bit-channel error probabilities $P_e^{(i)}$ is less than or equal to a target frame error rate $P_t$ for the universal polar code, wherein the indices corresponding to the k smallest $P_e^{(i)}$ are good bit-channels for the universal polar code.

In accordance with another aspect of the present disclosure, a method of constructing a universal polar code is provided. The method includes polarizing and degrading a class of channels $W_j$ to determine a probability of error $P_{e,j}$ of each bit-channel of $W_j$, wherein $j \in \{1, 2, \ldots, s\}$, in accordance with a bit-channel index i; determining a probability of error $P_e^{(i)}$ for the universal polar code for each bit-channel index i; sorting the $P_e^{(i)}$; and determining a largest number k of bit-channels such that a sum of corresponding k bit-channel error probabilities $P_e^{(i)}$ is less than or equal to a target frame error rate $P_t$ for the universal polar code, wherein the indices corresponding to the k smallest $P_e^{(i)}$ are good bit-channels for the universal polar code.

In accordance with another aspect of the present disclosure, a chipset for constructing a universal polar code is provided. The chipset is configured to polarize and degrade a class of channels $W_j$ to determine a probability of error $P_{e,j}$ of each bit-channel of $W_j$, wherein $j \in \{1, 2, \ldots, s\}$, in accordance with a bit-channel index i; determine a probability of error $P_e^{(i)}$ for the universal polar code for each bit-channel index i; sort the $P_e^{(i)}$; and determine a largest number k of bit-channels such that a sum of corresponding k bit-channel error probabilities $P_e^{(i)}$ is less than or equal to a target frame error rate $P_t$ for the universal polar code, wherein the indices corresponding to the k smallest $P_e^{(i)}$ are good bit-channels for the universal polar code.

The present disclosure concerns an apparatus and a method for channel polarization and degradation, determining a probability of error $P_e^{(i)}$ for a universal polar code for each bit-channel index i, sorting the $P_e^{(i)}$, and determining a largest number k of bit-channels such that a sum of corresponding k bit-channel error probabilities is less than or equal to a target frame error rate $P_t$ for the universal polar code.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
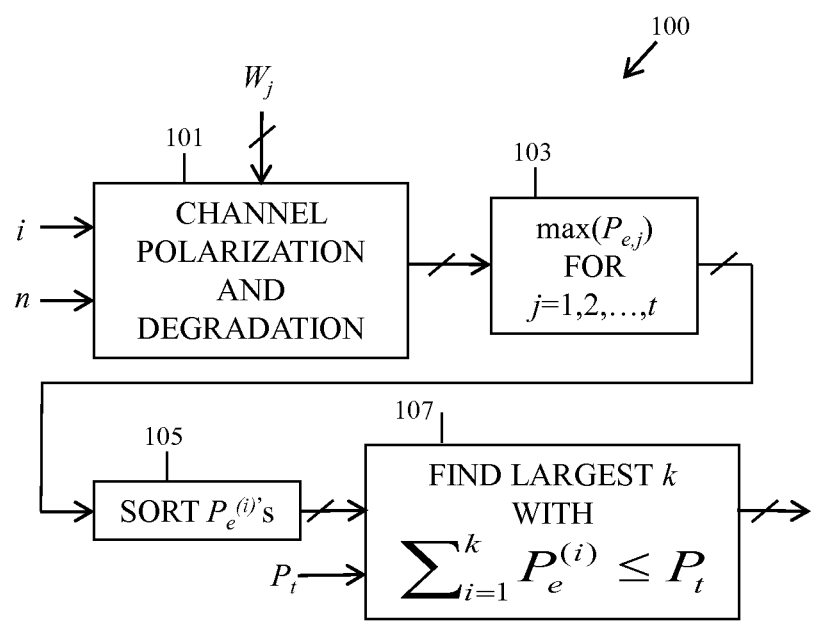
FIG. 1 is a schematic diagram of an apparatus for constructing a universal polar code according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments will now be described in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

In general, a channel W* is said to be degraded with respect to a channel W, if there exists another channel W' such that W* is a cascade of W and W'. Consequently, W is said to be upgraded with respect to W*. The present disclosure concerns degradation operations that result in a channel with a guaranteed fixed output alphabet size, where all of the channels in a class of channels $W_j = \{W_1, W_2, \ldots, W_S\}$ is given, and where all of the channels in the class have the same symmetric capacity. The length of a target polar code is $n=2^l$, where l is the depth of a corresponding polarization tree. For a binary channel W, $W^+$ and $W^-$ denote its two descendant polarized bit-channels through a channel polarization operation.

FIG. 1 is a schematic diagram of an apparatus 100 for constructing a universal polar code according to an embodiment of the present disclosure.

Referring to FIG. 1, the apparatus 100 includes a first function block 101 for channel polarization and degradation, a second function block 103 for determining a probability of error $P_e^{(i)}$ for a universal polar code for each bit-channel index i, a third function block 105 for sorting the $P_e^{(i)}$ in ascending order, and a fourth function block 107 for determining the largest number k of bit-channels such that a sum of corresponding k bit-channel error probabilities is less than or equal to a target frame error rate $P_t$ for the universal polar code.

The first function block 101 for channel polarization and degradation has a first input for receiving the length n of a target polarization code, a second input for receiving a bit-channel index i, an input bus for receiving the underlying channels $W_j$ from a class of channels, and an output bus at which appears the probability of error $P_{e,j}$ of each of the corresponding bit-channels of the polar codes constructed for the underlying channels $W_j$ in the class of channels. The first function block 101 for channel polarization and degradation recursively polarizes and degrades the bit-channels in accordance with the method illustrated in FIG. 3 and described in more detail below.

For a bit-channel index i and underlying channels $W_j$ from a class of channels, $P_{e,j}$ is the probability of error of the bit-channel $W_{n(i)}$ from a last level of a channel polarization tree constructed for $W_j$. The probability of error for any Binary Memoryless Symmetric (BMS) channel W with an output alphabet Y is given by Equation (1) as follows.

$$P_e(W)=\tfrac{1}{2}\Sigma_{y\in Y}\min\{W(y|0),W(y|1)\} \quad (1)$$

Equation (1) above is easy to compute for the degraded bit-channels which have a limited output alphabet size.

The second function block 103 in FIG. 1 has an input bus connected to the output bus of the first function block 101 for receiving the probability of error $P_{e,j}$ of each of the corresponding bit-channels of the polar codes constructed for the underlying channels $W_j$ in the class of channels and has an output bus at which appears an error probability $P_e^{(i)}$ for each bit-channel index i of the universal polar code. The second function block 103 determines, for each bit-channel index i, an error probability $P_e^{(i)}$ for the universal polar code, where $P_e^{(i)}$ may be calculated by determining a maximum of the probability of error $P_{e,j}$ of each of the corresponding bit-channels of the polar codes constructed for the underlying channels $W_j$ in the class of channels, where $j\in\{1,2,\ldots,s\}$. This process is repeated for each bit-channel index i.

The first function block 101, which involves the channel polarization and degradation operation, and the second function block 103 bound the probability of error $P_{e,j}$ for each of the bit-channels.

The third function block 105 has an input bus connected to the output bus of the second function block 103 for receiving an error probability $P_e^{(i)}$ for each bit-channel index i=1, 2, . . . , n, of the polar codes constructed for the underlying channels W in the class of channels, where $j\in\{1, 2, \ldots, s\}$ and has an output bus at which appears the sorted $P_e^{(i)}$ (e.g. sorted in ascending order).

The fourth function block 107 has an input bus connected to the output bus of the third function block 105 for receiving the sorted $P_e^{(i)}$, has an input for receiving a target frame error rate $P_t$, and has an output at which appears the largest number k of bit-channels such that a sum of corresponding k bit-channel error probabilities is less than or equal to a target frame error rate $P_t$ for the universal polar code.

The good bit-channels for the constructed universal polar code for the class of channels are indicated by the indices corresponding to the k smallest $P_e^{(i)}$, where the rate of the constructed universal polar code is k/n.

Figure 2:
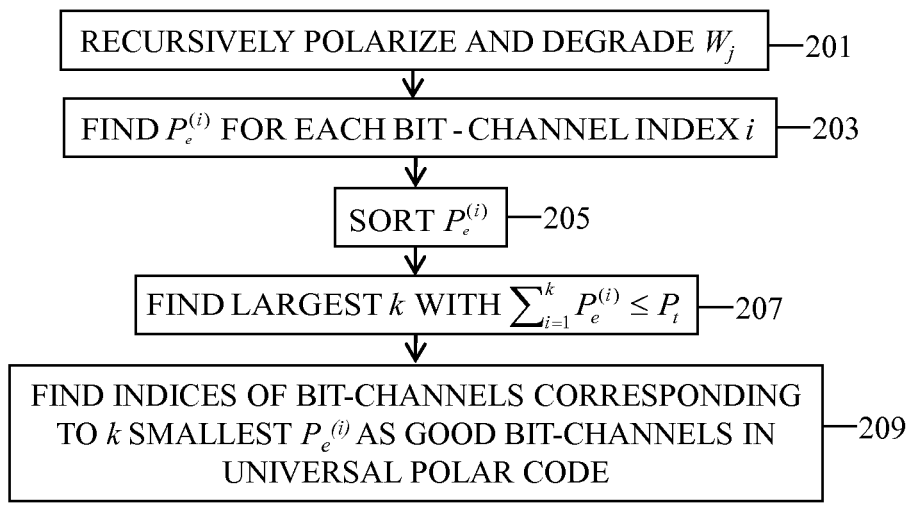
FIG. 2 is a flowchart of a method of constructing a universal polar code according to an embodiment of the present disclosure.

FIG. 2 is a flowchart of a method of constructing a universal polar code according to an embodiment of the present disclosure.

Referring to FIG. 2, an underlying class of channels $W_j$, where $j\in\{1, 2, \ldots, s\}$, in a class of channels is polarized and degraded in step 201 in accordance with a bit-channel index i=1, 2, . . . , n, and a length of a target polar code $n=2^l$, where l is the depth of a corresponding polarization tree. In step 201, the bit-channels are recursively polarized and degraded in accordance with the method illustrated in FIG. 3 and described in more detail below.

In step 203, a probability of error $P_e^{(i)}$ for a universal polar code for each bit-channel index i is determined. In an embodiment of the present disclosure, the $P_e^{(i)}$ are calculated by determining a maximum of the probability of error $P_{e,j}$ of each of the corresponding bit-channels of the polar codes constructed for the underlying channels $W_j$, in the class of channels, where $j\in\{1, 2, \ldots, s\}$. This process is repeated for each bit-channel index i. However, the present disclosure is not limited to calculating $P_e^{(i)}$ by determining a maximum of the probability of error $P_{e,j}$ of each of the corresponding bit-channels.

In step 205, the $P_e^{(i)}$ are sorted. In an embodiment of the present disclosure, the $P_e^{(i)}$ are sorted in ascending order. However, the present disclosure is not limited to sorting in ascending order.

In step 207, a largest number k of bit-channels is determined such that a sum of corresponding k bit-channel error probabilities $P_e^{(i)}$ is less than or equal to a target frame error rate $P_t$ for a universal polar code (i.e., $\Sigma_{i=1}^k P_e^{(i)} \leq P_t$).

Step 201, which involves a channel polarization and degradation operation, and step 203 bound the probability of error $P_{e,j}$ for each of the bit-channels.

The good bit-channels for the constructed universal polar code for the class of channels are indicated by the indices corresponding to the k smallest $P_e^{(i)}$, where the rate of the constructed universal polar code is k/n, in step 209.

Figure 3:
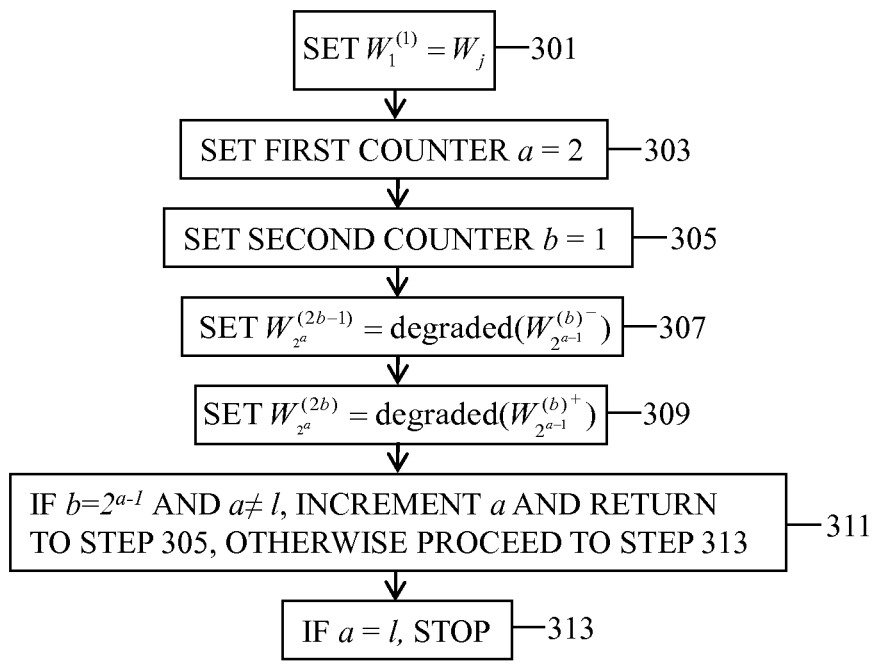
FIG. 3 is a flowchart of a method of constructing a channel polarization tree while degrading polarized bit-channels according to an embodiment of the present disclosure.

FIG. 3 is a flowchart of a method of constructing a channel polarization tree while degrading polarized bit-channels according to an embodiment of the present disclosure.

Referring to FIG. 3, $W_1^{(1)}$ is set to the channels $W_j$ in the class of channels in step 301.

In step 303, a first counter a is set to 2.

In step 305, a second counter b is set to 1.

In step 307, $W_{2^a}^{(2b-1)}$ is set to degraded $(W_{2^{a-1}}^{(b)^-})$.

In step 309, $W_{2^a}^{(2b)}$ is set to degraded $(W_{2^{a-1}}^{(b)^+})$.

In step 311, if $b=2^{a-1}$ and $a\neq l$, a is incremented and the method returns to step 305. Otherwise, the method proceeds to step 313.

In step 313, if a=l, then the method terminates.

Figure 4:
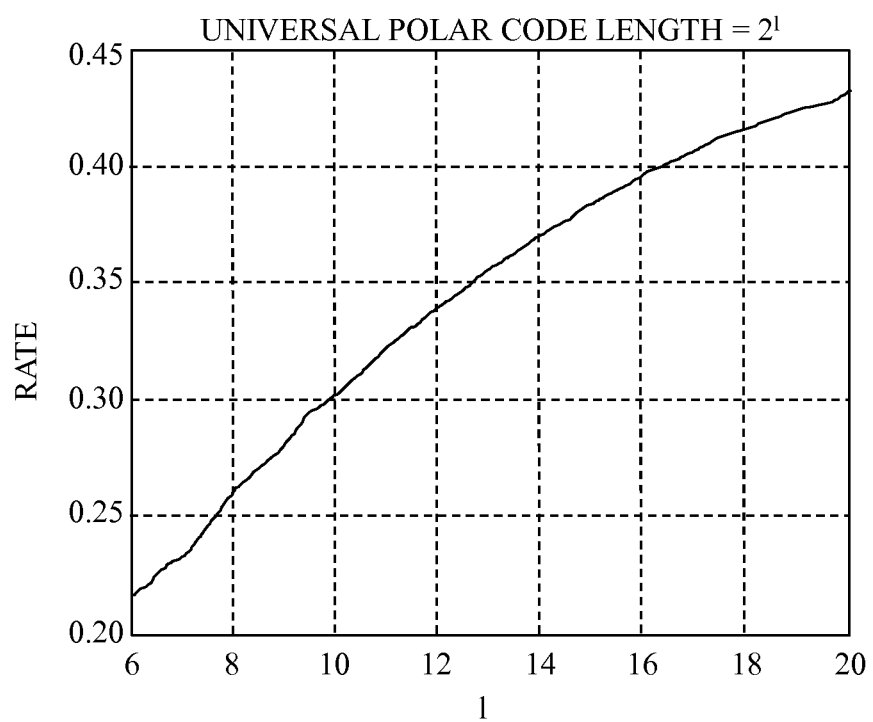
FIG. 4 is a chart of achievable rates of a universal polar code according to an embodiment of the present disclosure.

FIG. 4 is a chart of achievable rates of a universal polar code according to an embodiment of the present disclosure.

Referring to FIG. 4, achievable rates of a universal polar code in terms of a logarithm of block length l are shown for a class of binary input channels each with a capacity of 0.5, where a Binary Erasure Channel (BEC) has erasure probability 0.5 denoted by BEC(0.5), a Binary Symmetric Channel (BSC) has crossover probability 0.11 denoted by BSC (0.11), and a binary Additive White Gaussian Noise (AWGN) channel has a Signal to Noise Ratio (SNR) of -2.82 dB, where the x-axis is block length l, and the y-axis is the achievable rate. For a target frame error rate 0.01, a universal code is constructed according to the present disclosure. For the BEC, an exact probability of error of the bit-channels can be computed. For the BSC and AWGN, the present disclosure bounds the error probabilities of the bit-channels. For a block length $n=2^{20}$ and an l=20, a rate of 0.43 is achievable.

In an embodiment of the present disclosure, a universal polar code can be constructed for any desired rate R=k/n, by picking k bit-channels with the lowest $P_e^{(i)}$ which are attributed to the universal polar code.

In an embodiment of the present disclosure, for short block lengths, the error probabilities $P_{e,j}$ of the bit-channels can be accurately approximated for each transmission channel by Monte-Carlo simulations of a genie-aided successive interference cancellation decoder on that channel. This is feasible at short block lengths. For channels, as the binary erasure channel, the bit-channel error probability can be calculated exactly using recursive formulas.

Figure 5:
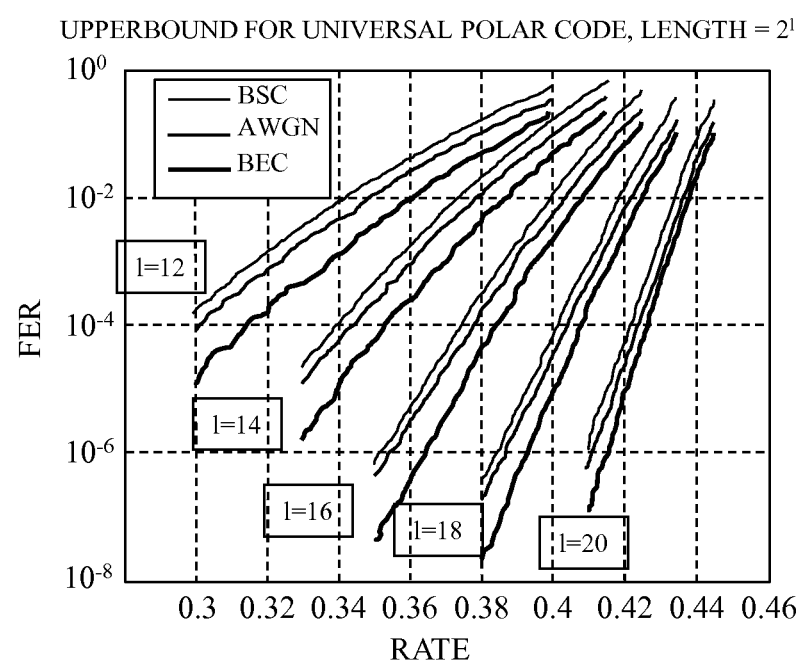
FIG. 5 is a chart of Frame Error Rate (FER) of a universal polar code versus a rate of the universal polar code according to an embodiment of the present disclosure.

FIG. 5 is a chart of Frame Error Rate (FER) of a universal polar code versus a rate of the universal polar code according to an embodiment of the present disclosure.

Referring to FIG. 5, upper-bounds on the performance of a universal polar code over the three channels BSC, AWGN, and BEC are illustrated.

An asymptotic lower bound and upper bound on the rate of a universal polar code are derived below. The probability of error of all bit-channels for a channel W can be upper bounded by the corresponding bit-channels of a BEC with erasure probability Z(W), where Z(W) is the Bhattacharyya parameter of W. Thus, a lower bound on the achievable rate for a universal polar code, denoted by RU is 1-max{Z(W)}, where the maximum is taken over all Ws in the given family of channels. For example, for a group of BEC, BSC, and AWGN, the BSC has the maximum Bhattacharyya parameter. Hence, by considering one level of polarization, an $R_U \geq 0.3742$ is achieved. This bound can be generalized if more polarization levels are considered. For any $$N = 2^n, R_U \geq 1 - \frac{1}{N}\sum_{i=1}^{N} \max\{Z(W_N^{(i)})\}.$$

Similarly, $$R_U \leq \frac{1}{N}\sum_{i=1}^{N} \min\{Z(W_N^{(i)})\}.$$

In order to compute these bounds, the degraded and upgraded bit-channels may be used. For the lower bound, an upper bound on the Bhattacharyya parameters of the bit-channels for each channel in the family of channels is obtained by the degrading operation. Then, the results are used in $$R_U \geq 1 - \frac{1}{N}\sum_{i=1}^{N} \max\{Z(W_N^{(i)})\}.$$

For the family of BEC, BSC, and AWGN, the computed lower bound using an $N=2^{20}$ is $R_U \geq 0.4786$. For the upper bound, an upper bound is obtained on the symmetric capacity of the bit-channels by an upgrading operation. For example, the computed upper bound is $R_U \leq 0.4821$. Thus, the asymptotic achievable rate $R_U$ for the universal polar code for the BEC, BSC, and AWGN of capacity 0.5 satisfies $0.4786 \leq R_U \leq 0.4821$.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereof.

What is claimed is:

1. An apparatus for constructing a universal polar code, comprising:
  a first device, including a first input for receiving a bit-channel index i, a second input for receiving an integer n, and an output bus, wherein the first device is configured to polarize and degrade a class of channels $W_j$ to determine a probability of error $P_{e,j}$ of each bit-channel of $W_j$, wherein $j \in \{1, 2, \ldots, s\}$, in accordance with the bit-channel index i;
  a second device, including an input bus connected to the output bus of the first module, and an output bus, wherein the second module is configured to determine a probability of error $P_e^{(i)}$ for the universal polar code for each bit-channel index i;
  a third device, including an input bus connected to the output bus of the second module, and an output bus, wherein the third module is configured to sort the $P_e^{(i)}$; and
  a fourth device, including a first input bus connected to the output bus of the third module, a second input for receiving a target flame error rate $P_t$, and an output bus, wherein the fourth module is configured to determine a largest number k of bit-channels such that a sum of corresponding k bit-channel error probabilities $P_e^{(i)}$ is less than or equal to the target frame error rate $P_t$ for the universal polar code, wherein the indices corresponding to the k smallest $P_e^{(i)}$ are good bit-channels for the universal polar code.

2. The apparatus of claim 1, wherein i=1, 2, . . . , n, where n is a length of the universal polar code.

3. The apparatus of claim 2, wherein $n=2^l$, where l is a depth of a corresponding polarization tree.

4. The apparatus of claim 1, wherein each channel in the class of channels $W_j$ has a symmetric capacity that is equal to each other.

5. The apparatus of claim 1, wherein the $P_e^{(i)}$ are sorted in ascending order.

6. The apparatus of claim 1, wherein each probability of error $P_e^{(i)}$ is a maximum of a probability of error of each $P_{e,j}$ of the corresponding bit-channels of the universal polar code for $W_j$.

7. The apparatus of claim 1, wherein the first device is further configured to:
  set $W_1^{(1)}$ to $W_j$;
  set a first counter a to 2;
  set a second counter b to 1;
  set $W_{2^a}^{(2b-1)}$ to degraded $(W_{2^{a-1}}^{(b)})^-$;
  set $W_{2^a}^{(2b)}$ to degraded $(W_{2^{a-1}}^{(b)})^+$;
  if $b=2^{a-1}$ and $a \neq l$, increment a and return to the step of setting b to 1, otherwise proceed to the following step; and
  if a=l then stop.

8. The apparatus of claim 1, wherein each $P_{e,j}$ is approximated by Monte-Carlo simulations of a genie-aided successive interference cancellation decoder on the corresponding bit-channel.

9. The apparatus of claim 1, wherein an asymptotic lower bound on a rate $R_U$ of the universal polar code is $$R_U \geq 1 - \frac{1}{N}\sum_{i=1}^{N} \max\{Z(W_N^{(i)})\},$$

where $N=2^n$ and $Z(W_N^{(i)})$ is a Bhattacharyya parameter of $W_N^{(i)}$, and wherein an asymptotic upper bound on $R_U$ is $$R_U \leq \frac{1}{N}\sum_{i=1}^{N} \min\{Z(W_N^{(i)})\}.$$

10. A method of constructing a universal polar code in an apparatus, comprising:
  polarizing and degrading, by a first device, a class of channels $W_j$ to determine a probability of error $P_{e,j}$ of each bit-channel of $W_j$, wherein $j \in \{1, 2, \ldots, s\}$, in accordance with a bit-channel index i;
  determining, by a second device, a probability of error $P_e^{(i)}$ for the universal polar code for each bit-channel index i;

sorting, by a third device, the $P_e^{(i)}$; and determining, by a fourth device, a largest number k of bit-channels such that a sum of corresponding k bit-channel error probabilities $P_e^{(i)}$ is less than or equal to a target frame error rate $P_t$ for the universal polar code, wherein the indices corresponding to the k smallest $P_e^{(i)}$ are good bit-channels for the universal polar code.

11. The method of claim 10, wherein i=1, 2, ..., n, where n is a length of the universal polar code.

12. The method of claim 11, wherein n=$2^l$, where l is a depth of a corresponding polarization tree.

13. The method of claim 10, wherein each channel in the class of channels $W_j$ has a symmetric capacity that is equal to each other.

14. The method of claim 10, wherein the $P_e^{(i)}$ are sorted in ascending order.

15. The method of claim 10, wherein each probability of error $P_e^{(i)}$ is a maximum of a probability of error of each $P_{e,j}$ of the corresponding bit-channels of the universal polar code for $W_j$.

16. The method of claim 10, wherein polarizing and degrading the class of channels $W_j$ comprises:

setting $W_1^{(1)}$ to $W_j$;
setting a first counter a to 2;
setting a second counter b to 1;
setting $W_{2^a}^{(2b-1)}$ to degraded $(W_{2^{a-1}}^{(b)^-})$;
setting $W_{2^a}^{(2b)}$ to degraded $(W_{2^{a-1}}^{(b)^+})$;
if b=$2^{a-1}$ and a≠l, increment a and return to the step of setting b to 1, otherwise proceed to the following step; and
if a=l then stopping.

17. The method of claim 10, wherein each $P_{e,j}$ is approximated by Monte-Carlo simulations of a genie-aided successive interference cancellation decoder on the corresponding bit-channel.

18. The method of claim 10, wherein an asymptotic lower bound on a rate $R_U$ of the universal polar code is $$R_U \geq 1 - \frac{1}{N} \sum_{i=1}^{N} \max\{Z(W_N^{(i)})\},$$

where N=$2^n$ and $Z(W_N^{(i)})$ is a Bhattacharyya parameter of $W_N^{(i)}$, and wherein an asymptotic upper bound on $R_U$ is $$R_U \leq \frac{1}{N} \sum_{i=1}^{N} \min\{Z(W_N^{(i)})\}.$$

19. A chipset for constructing a universal polar code, the chipset configured to:

polarize and degrade, by a first device, a class of channels $W_j$ to determine a probability of error $P_{e,j}$ of each bit-channel of $W_j$, wherein j∈{1, 2, ..., s}, in accordance with a bit-channel index i;

determine, by a second device, a probability of error $P_e^{(i)}$ for the universal polar code for each bit-channel index i, sort, by a third device, $P_e^{(i)}$; and determine, by a fourth device, a largest number k of bit-channels such that a sum of corresponding k bit-channel error probabilities $P_e^{(i)}$ is less than or equal to a target frame error rate Pt for the universal polar code, wherein the indices corresponding to the k smallest $P_e^{(i)}$ are good bit-channels for the universal polar code.

20. The chipset of claim 19, wherein i=1, 2, ..., n, wherein n is a length of the universal polar code.

* * * * *